United States Patent [19]
Lee

[11] Patent Number: 5,633,603
[45] Date of Patent: May 27, 1997

[54] DATA OUTPUT BUFFER USING PASS TRANSISTORS BIASED WITH A REFERENCE VOLTAGE AND A PRECHARGED DATA INPUT

[75] Inventor: Jae J. Lee, Kyoungki-do, Rep. of Korea

[73] Assignee: Hyundai Electronics Industries Co., Ltd., Ichon-kun, Rep. of Korea

[21] Appl. No.: 579,578

[22] Filed: Dec. 26, 1995

[51] Int. Cl.$^6$ .............................. H03K 19/0185
[52] U.S. Cl. ................ 326/83; 326/17; 326/58; 326/113
[58] Field of Search ............... 326/82, 83, 86, 326/17, 56, 57, 58, 113

[56] References Cited

U.S. PATENT DOCUMENTS

| 3,739,193 | 6/1973 | Pryor | 326/113 |
|---|---|---|---|
| 4,491,749 | 1/1985 | Iwamura | 326/86 |
| 4,746,818 | 5/1988 | Hafner | 326/56 |
| 5,111,076 | 5/1992 | Tarng | 326/83 |
| 5,297,097 | 3/1994 | Etoh et al. | 365/229 |
| 5,367,645 | 11/1994 | Lubeck et al. | 326/83 |
| 5,512,854 | 4/1996 | Park | 327/374 |

FOREIGN PATENT DOCUMENTS

2352449  12/1977  France ..................... 326/58

Primary Examiner—Edward P. Westin
Assistant Examiner—Benjamin D. Driscoll
Attorney, Agent, or Firm—Gary M. Nath; Nath & Associates

[57] ABSTRACT

A data output buffer circuit for a semiconductor device for transferring read cell data to the peripheral circuits, comprising an input terminal for inputting the read cell data, a first NMOS transistor for transferring the data from the input terminal when it has a first logic level, a first PMOS transistor for transferring the data from the input terminal when it has a second logic level, a second PMOS transistor for transferring a high logic signal in response to an output signal from the first NMOS transistor, a second NMOS transistor for transferring a low logic signal in response to an output signal from the first PMOS transistor, and an output terminal for outputting the high logic signal from the second PMOS transistor or the low logic signal from the second NMOS transistor to the peripheral circuits.

9 Claims, 5 Drawing Sheets

DATA OUTPUT BUFFER USING PASS TRANSISTORS BIASED WITH A REFERENCE VOLTAGE AND A PRECHARGED DATA INPUT

BACKGROUND OF THE INVENTION

1. Field of the Invention

The present invention relates in general to data output buffer circuits used in semiconductor integrated circuits, and more particularly to a data output buffer circuit for a semiconductor device in which a single data line precharged with a half voltage (Vcc/2) is used to enhance the operation speed and reduce a layout area on the chip.

2. Description of the Prior Art

Figure 1:
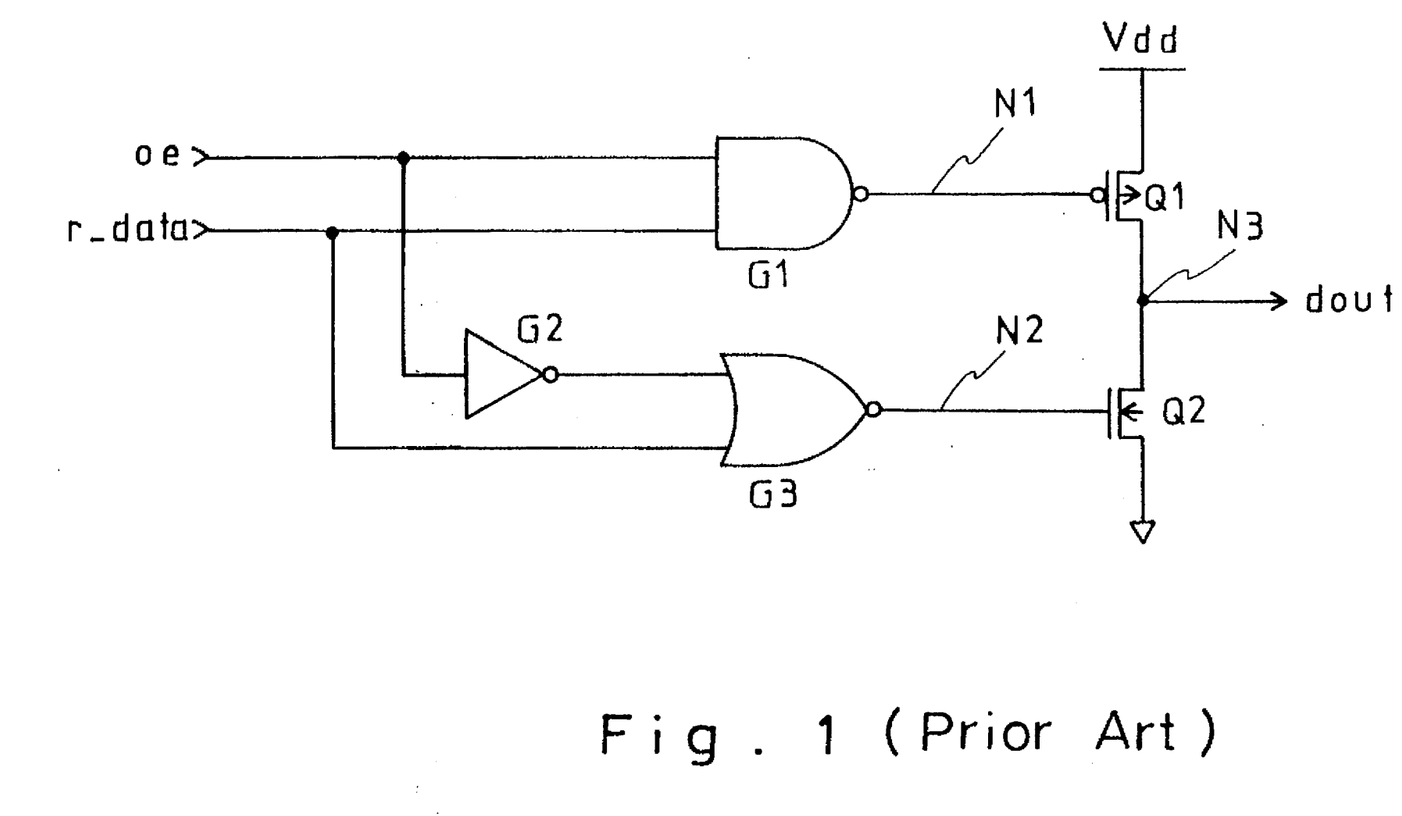
FIG. 1 is a circuit diagram of a conventional data output buffer circuit for a semiconductor device employing a single data line for the data transfer.

Referring to FIG. 1, there is shown a circuit diagram of a conventional data output buffer circuit for a semiconductor device employing a single data line for the data transfer. As shown in this drawing, the conventional data output buffer circuit comprises a NAND gate G1 for inputting a read data signal r_data on a read data line and a data output buffer enable signal oe, an inverter G2 for inverting the data output buffer enable signal oe, a NOR gate G3 for inputting the read data signal r_data and an output signal from the inverter G2, a PMOS pull-up transistor Q1 connected between a supply voltage source Vdd and a node N3, an NMOS pull-down transistor Q2 connected between the node N3 and a ground voltage source Vss, and an output terminal dout connected to the node N3. The PMOS pull-up transistor Q1 has its gate connected to an output terminal of the NAND gate G1 and the NMOS pull-down transistor Q2 has its gate connected to an output terminal of the NOR gate G3.

The operation of the conventional data output buffer circuit with the above-mentioned construction will hereinafter be described.

When the read data signal r_data is placed on the read data line, it is logically combined with the data output buffer enable signal oe by the NAND gate G1 and NOR gate G3 and then applied to the gates of the PMOS pull-up transistor Q1 and NMOS pull-down transistor Q2. At this time, if the read data signal r_data is high in logic, signals on nodes N1 and N2 are both low in logic, thereby, causing the PMOS pull-up transistor Q1 to be turned on and the NMOS pull-down transistor Q2 to be turned off. As a result, the read data signal r_data of high logic is transferred to the output terminal dout. On the contrary, in the case where the read data signal r_data is low in logic, the signals at the nodes N1 and N2 are both high in logic, thereby causing the PMOS pull-up transistor Q1 to be turned off and the NMOS pull-down transistor Q2 to be turned on. As a result, the read data signal r_data of low logic is transferred to the output terminal dout.

The above-mentioned conventional data output buffer circuit is advantageous in that it occupies a small area on the chip because of the use of single data line. However, error data may be outputted in the case where the data output buffer enable signal oe is enabled earlier than the read data signal r_data. For this reason, the data output buffer enable signal oe must be enabled later than the read data signal r_data. This results in a reduction in operation speed of the data output buffer circuit.

Figure 2:
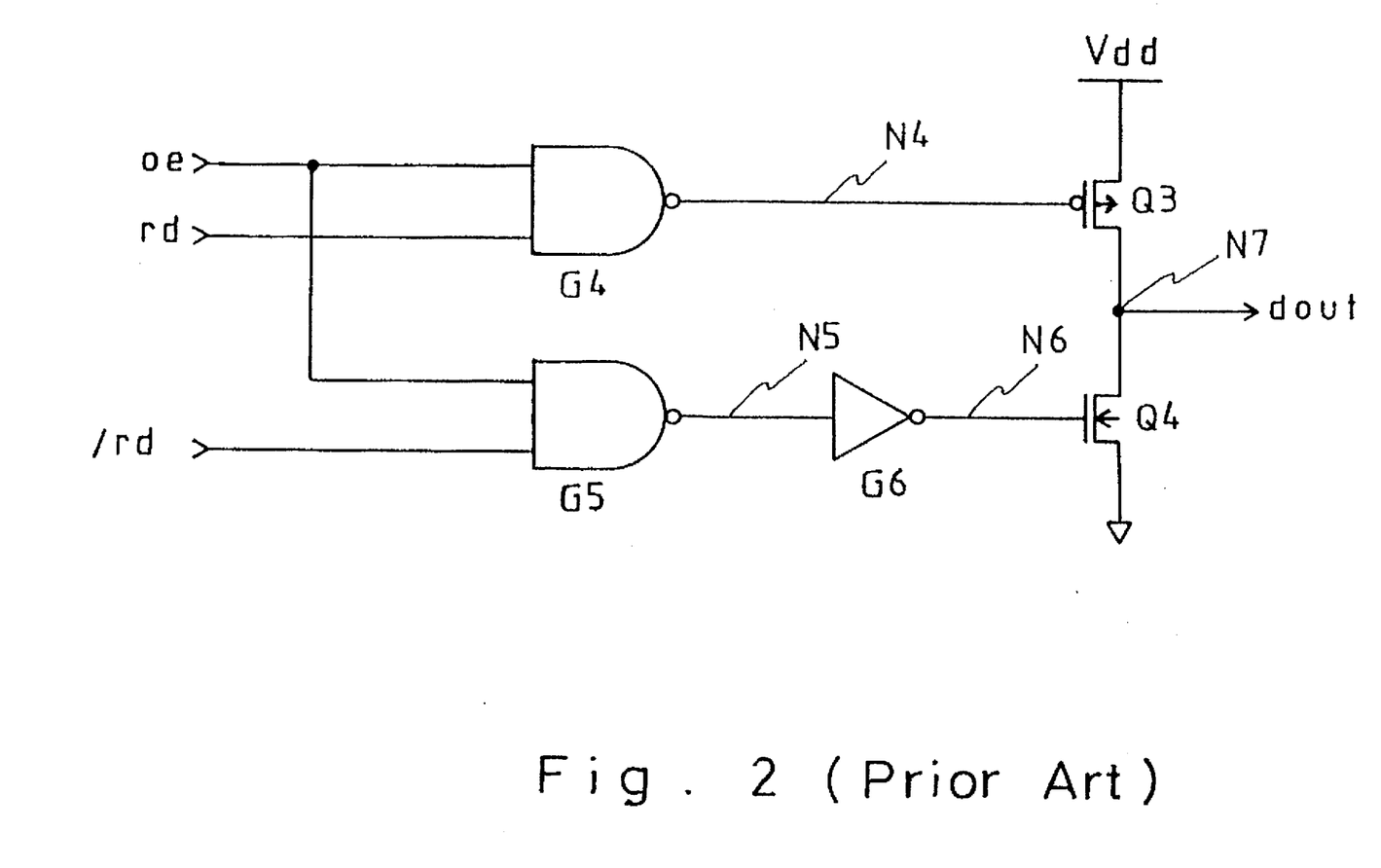
FIG. 2 is a circuit diagram of a conventional data output buffer circuit for a semiconductor device employing two data lines for the data transfer.

Referring to FIG. 2, there is shown a circuit diagram of a conventional data output buffer circuit for a semiconductor device employing two data lines for the data transfer. As shown in this drawing, the conventional data output buffer circuit comprises a NAND gate G4 for inputting a first read data signal rd on a first read data line and a data output buffer enable singal oe, a NAND gate G5 for inputting a second read data signal /rd on a second read data line and the data output buffer enable signal oe, an inverter G6 for inverting an output signal from the NAND gate G5, a PMOS pull-up transistor Q3 connected between a supply voltage source Vdd and a node N7, an NMOS pull-down transistor Q4 connected between the node N7 and a ground voltage source Vss, and an output terminal dout connected to the node N7. The PMOS pull-up transistor Q3 has its gate connected to an output terminal of the NAND gate G4 and the NMOS pull-down transistor Q4 has its gate connected to an output terminal of the inverter G6.

The operation of the conventional data output buffer circuit with the above-mentioned construction will hereinafter be described.

At the initial state, both the two data lines are precharged with low logic levels. Then, when the first and second read data signals rd and /rd are placed on the first and second read data lines, respectively, they are logically combined with the data output buffer enable signal oe by the NAND gate G4 and G5 and then applied to the gates of the PMOS pull-up transistor Q3 and NMOS pull-down transistor Q4. At this time, the PMOS pull-up transistor Q3 and the NMOS pull-down transistor Q4 are operated in response to voltage levels on nodes N4 and N6, respectively, to transfer data to the output terminal dout.

In the conventional data output buffer circuit of FIG. 2, both the two data lines rd and /rd are precharged with low logic levels at the initial state. Under this condition, the data output buffer enable signal oe is made active earlier than the read data signal to vary the output signal with a variation of the input signal. Therefore, the conventional data output buffer circuit can be operated at high speed. However, the conventional data output buffer circuit has a disadvantage in that it occupies a large area on the chip because of the use of two data lines.

SUMMARY OF THE INVENTION

Therefore, the present invention has been made in view of the above problems, and it is an object of the present invention to provide a data output buffer circuit for a semiconductor device in which a single data line is used to enhance the operation speed and reduce a layout area on the chip.

In accordance with an aspect of the present invention, there is provided a data output buffer circuit for a semiconductor device for transferring read cell data to the peripheral circuits, comprising an input terminal for inputting the read cell data; first data transfer means for transferring the data from the input terminal when it has a first logic level; second data transfer means for transferring the data from the input terminal when it has a second logic level; high logic transfer means for transferring a high logic signal in response to an output signal from the first data transfer means; low logic transfer means for transferring a low logic signal in response to an output signal from the second data transfer means; and an output terminal for outputting the high logic signal from the high logic transfer means or the low logic signal from the low logic transfer means to the peripheral circuits.

In accordance with another aspect of the present invention, there is provided a data output buffer circuit for a semiconductor device for transferring read cell data to the peripheral circuits, comprising an input terminal for inputting the read cell data; first data transfer means for transferring the data from the input terminal when it has a first logic level; second data transfer means for transferring the data from the input terminal when it has a second logic level; high logic transfer means for transferring a high logic signal in response to an output signal from the first data transfer means; low logic transfer means for transferring a low logic signal in response to an output signal from the second data transfer means; an output terminal for outputting the high logic signal from the high logic transfer means or the low logic signal from the low logic transfer means to the peripheral circuits; first operation control means connected between the first data transfer means and the high logic transfer means, for setting a level of the output signal from the first data transfer means to a supply voltage level in a standby mode to control the operation of the high logic transfer means; and second operation control means connected between the second data transfer means and the low logic transfer means, for setting a level of the output signal from the second data transfer means to a ground voltage level in the standby mode to control the operation of the low logic transfer means.

In accordance with still another aspect of the present invention, there is provided a data output buffer circuit for a semiconductor device for transferring read cell data to the peripheral circuits, comprising an input terminal for inputting the read cell data; first data transfer means for transferring the data from the input terminal when it has a first logic level; second data transfer means for transferring the data from the input terminal when it has a second logic level; high logic transfer means for transferring a high logic signal in response to an output signal from the first data transfer means; low logic transfer means for transferring a low logic signal in response to an output signal from the second data transfer means; an output terminal for outputting the high logic signal from the high logic transfer means or the low logic signal from the low logic transfer means to the peripheral circuits; first operation control means connected between the first data transfer means and the high logic transfer means, for setting a level of the output signal from the first data transfer means to a supply voltage level in a standby mode to control the operation of the high logic transfer means and for controlling an amount of current flowing through the high logic transfer means in an operation mode to transfer the high logic signal to the output terminal; and second operation control means connected between the second data transfer means and the low logic transfer means, for setting a level of the output signal from the second data transfer means to a ground voltage level in the standby mode to control the operation of the low logic transfer means and for controlling an amount of current flowing through the low logic transfer means in the operation mode to transfer the low logic signal to the output terminal.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 3:
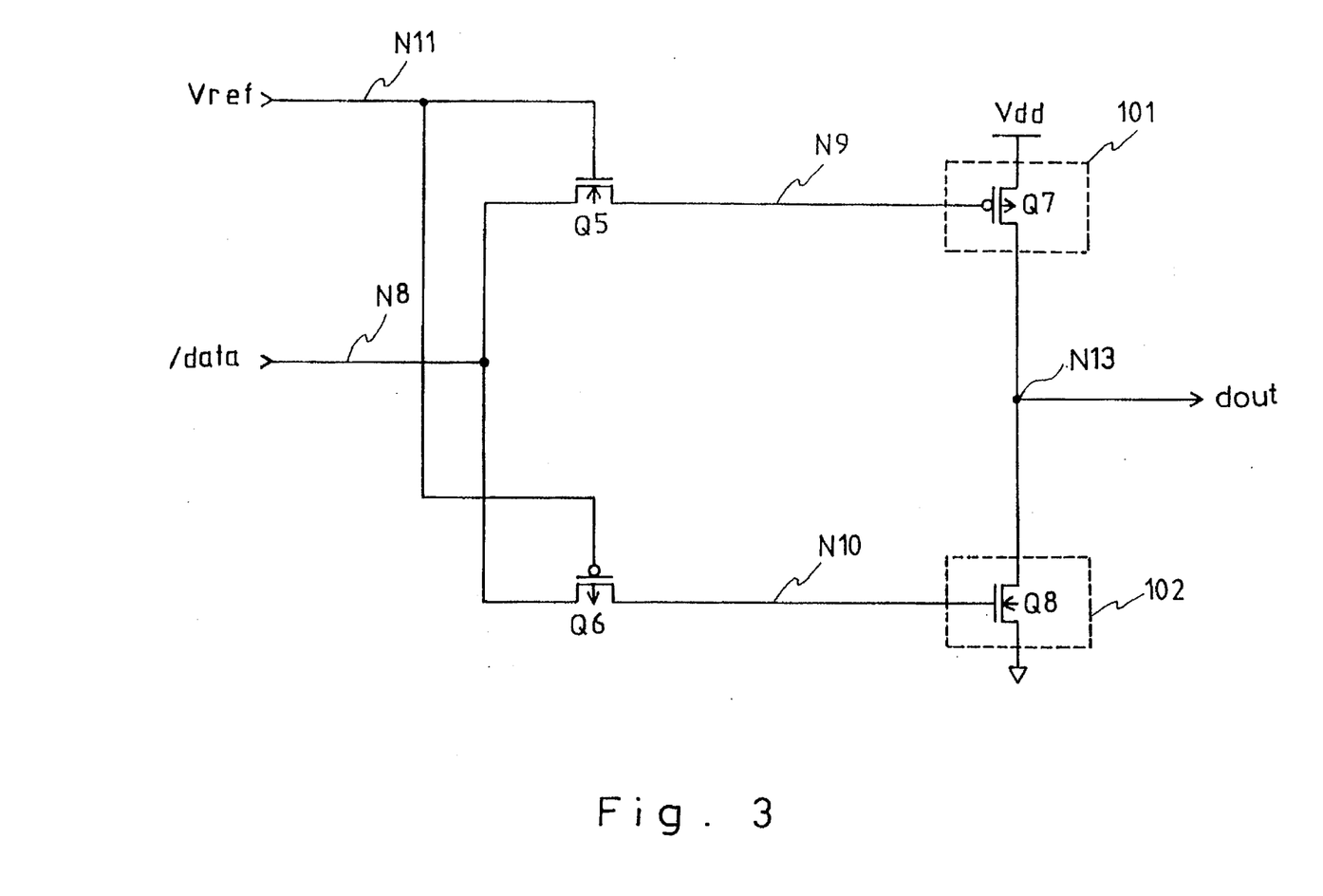
FIG. 3 is a circuit diagram of a data output buffer circuit for a semiconductor device in accordance with a first embodiment of the present invention.

Referring to FIG. 3, there is shown a circuit diagram of a data output buffer circuit for a semiconductor device in accordance with a first embodiment of the present invention. As shown in this drawing, the data output buffer circuit comprises an NMOS transistor Q5 connected between nodes N8 and N9, a PMOS transistor Q6 connected between the node N8 and a node N10, a PMOS transistor Q7 connected between a supply voltage source Vdd and a node N13, an NMOS transistor Q8 connected between the node N13 and a ground voltage source Vss, and an output terminal dout connected to the node N13. The node N8 is connected to a data line. The NMOS transistor Q5 and the PMOS transistor Q6 have their gates connected in common to a node N11 for inputting a reference voltage Vref. The PMOS transistor Q7 has its gate connected to the node N9 and the NMOS transistor Q8 has its gate connected to the node N10.

The operation of the data output buffer circuit with the above-mentioned construction in accordance with the first embodiment of the present invention will hereinafter be described in detail.

When a voltage at the node N8 is lower than the reference voltage Vref at the node N11 by a threshold voltage, the NMOS transistor Q5 is turned on to transfer the voltage at the node N8 to the node N9 connected to the gate of the PMOS transistor Q7. As a result, the PMOS transistor Q7 is turned on to transfer a high logic signal at the node N13 to the output terminal dout.

On the contrary, in the case where the voltage at the node N8 is higher than the reference voltage Vref at the node N11 by the threshold voltage, the PMOS transistor Q6 is turned on to transfer the voltage at the node N8 to the node N10 connected to the gate of the NMOS transistor Q8. As a result, the NMOS transistor Q8 is turned on to transfer a low logic signal at the node N13 to the output terminal dout.

Figure 4:
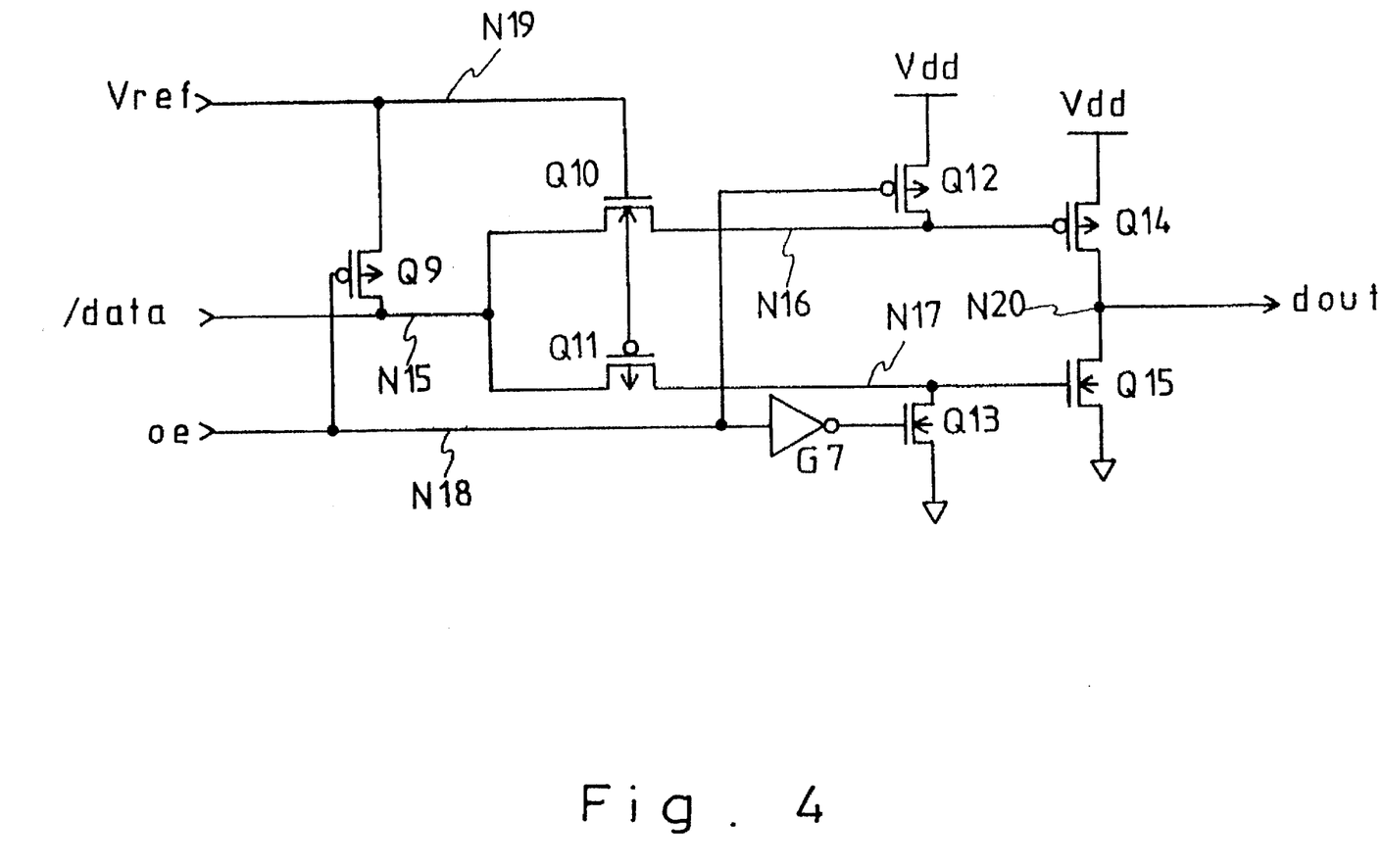
FIG. 4 is a circuit diagram of a data output buffer circuit for a semiconductor device in accordance with a second embodiment of the present invention.

Referring to FIG. 4, there is shown a circuit diagram of a data output buffer circuit for a semiconductor device in accordance with a second embodiment of the present invention. As shown in this drawing, the data output buffer circuit comprises an NMOS transistor Q10 connected between nodes N15 and N16, a PMOS transistor Q11 connected between the node N15 and a node N17, a PMOS transistor Q9 connected between a node N19 and the node N15, a PMOS transistor Q12 connected between a supply voltage source Vdd and the node N16, a PMOS transistor Q14 connected between the supply voltage source Vdd and a node N20, an NMOS transistor Q13 connected between the node N17 and a ground voltage source Vss, an NMOS transistor Q15 connected between the node N20 and the ground voltage source Vss, an inverter G7 for inverting a data output buffer enable signal oe at a node N18, and an output terminal dout connected to the dout N20. The node N15 is connected to a data line/data and the node N19 is applied with a reference voltage Vref. The NMOS transistor Q10 and the PMOS transistor Q11 have their gates connected in common to the node N19. The PMOS transistors Q9 and Q12 have their gates connected in common to the node N18. The NMOS transistor Q13 has its gate connected to an output terminal of the inverter G7, the PMOS transistor Q14 has its gate connected to the node N16 and the NMOS transistor Q15 has its gate connected to the node N17.

The operation of the data output buffer circuit with the above-mentioned construction in accordance with the second embodiment of the present invention will hereinafter be described in detail.

At the initial state, the data line /data is precharged with a half voltage Vcc/2, the node N16 connected to the gate of the high logic transfer device or PMOS transistor Q14 is precharged with a supply voltage Vcc and the node N17 connected to the gate of the low logic transfer device or NMOS transistor Q15 is precharged with a ground voltage gnd. Under this condition, when a signal on the data line/data precharged with the half voltage Vcc/2 goes high in logic, the PMOS transistor Q11 is turned on as a voltage at the node N15 becomes higher than the reference voltage Vref at the node N19 by a threshold voltage Vth. As the PMOS transistor Q11 is turned on, it transfers the voltage at the node N15 to the node N17. As a result, the low logic transfer device or NMOS transistor Q15 is turned on to transfer a low logic signal at the node N20 to the output terminal dout.

On the other hand, in the case where the signal on the data line /data precharged with the half voltage Vcc/3 goes low in logic, the NMOS transistor Q10 is turned on as the voltage at the node N15 becomes lower than the reference voltage Vref at the node N19 by the threshold voltage Vth. As the NMOS transistor Q10 is turned on, it transfers the voltage at the node N15 to the node N16. As a result, the high logic transfer device or PMOS transistor Q14 is turned on to transfer a high logic signal at the node N20 to the output terminal dout.

The data output buffer enable signal oe at the node N18 is capable of disabling the output terminal dout. Namely, when the data output buffer enable signal oe at the node N18 is low in logic, a voltage at the node N16 goes high in logic, thereby causing the high logic transfer device or PMOS transistor Q14 to be turned off. Also, a voltage at the node N17 goes low in logic, thereby causing the low logic transfer device or NMOS transistor Q15 to be turned off. As a result, any data is not transferred to the output terminal dout.

On the contrary, in the case where the data output buffer enable signal oe at the node N18 is high in logic, the PMOS transistor Q12 and the NMOS transistor Q13 are turned off, and the PMOS transistor Q14 and the NMOS transistor Q15 are operated according to logic states of the nodes N16 and N17 to transfer data to the output terminal.

Figure 5:
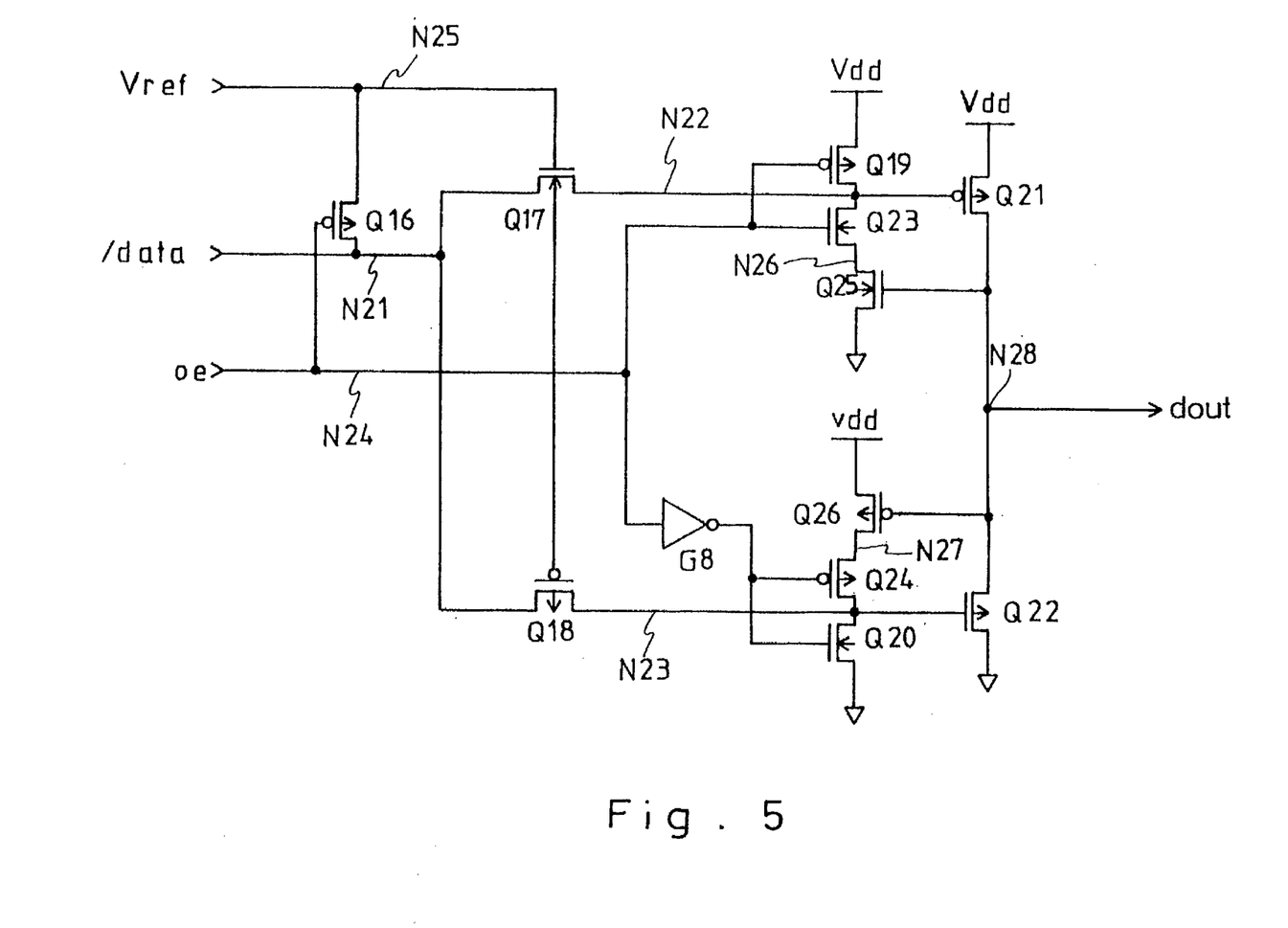
FIG. 5 is a circuit diagram of a data output buffer circuit for a semiconductor device in accordance with a third embodiment of the present invention.

Referring to FIG. 5, there is shown a circuit diagram of a data output buffer circuit for a semiconductor device in accordance with a third embodiment of the present invention. As shown in this drawing, the data output buffer circuit comprises and NMOS transistor Q17 connected between nodes N21 and N22, a PMOS transistor Q18 connected between the node N21 and a node N23, a PMOS transistor Q16 connected between a node N25 and the node N21, a PMOS transistor Q19 connected between a supply voltage source Vdd and the node N22, and an NMOS transistor Q23 connected between the node N22 and a node N26. The node N21 is connected to a data line /data and the node N25 is applied with a reference voltage Vref. The NMOS transistor Q17 and the PMOS transistor Q18 have their gates connected in common to the node N25. The PMOS transistors Q16 and Q19 and the NMOS transistor Q23 have their gates connected in common to a node N24 for inputting a data output buffer enable signal oe.

The data output buffer circuit further comprises an NMOS transistor Q25 connected between the node N26 and a ground voltage source Vss, a PMOS transistor Q21 connected between the supply voltage source Vdd and a node N28, a PMOS transistor Q26 connected between the supply voltage source Vdd and a node N27, an inverter G8 for inverting the data output buffer enable signal oe at the node N24, a PMOS transistor Q24 connected between the node N27 and the node N23, an NMOS transistor Q20 connected between the node N23 and the ground voltage source Vss, and NMOS transistor Q22 connected between the node N28 and the ground voltage source Vss, and an output terminal dout connected to the node N28. The NMOS transistor Q25 and the PMOS transistor Q26 have their gates connected in common to the node N28. The PMOS transistor Q21 has its gate connected to the node N22 and the NMOS transistor Q22 has its gate connected to the node N23. The PMOS transistor Q24 and the NMOS transistor Q20 have their gates connected in common to an output terminal of the inverter G8.

The operation of the data output buffer circuit with the above-mentioned construction in accordance with the third embodiment of the present invention will hereinafter be described in detail.

At the initial state, the data line /data is precharged with a half voltage Vcc/2, the node N22 connected to the gate of the high logic transfer device or PMOS transistor Q21 is precharged with a supply voltage Vcc and the node N23 connected to the gate of the low logic transfer device or NMOS transistor Q22 is precharged with a ground voltage gnd. Under this condition, when a signal on the data line /data precharged with the half voltage Vcc/2 goes high in logic, the PMOS transistor Q18 is turned on as a voltage at the node N21 becomes higher than the reference voltage Vref at the node N25 by a threshold voltage Vth. As the PMOS transistor Q18 is turned on, it transfers the voltage at the node N21 to the node N23. As a result, the low logic transfer device or NMOS transistor Q22 is turned on the transfer a low logic signal at the node N28 to the output terminal dout.

On the other hand, in the case where the signal on the data line /data precharged with the half voltage Vcc/2 goes low in logic, the NMOS transistor Q17 is turned on as the voltage at the node N21 becomes lower than the reference voltage Vref at the node N25 by the threshold voltage Vth. As the NMOS transistor Q17 is turned on, it transfers the voltage at the node N21 to the node N22. As a result, the high logic transfer device or PMOS transistor Q21 is turned on to transfer a high logic signal at the node N28 to the output terminal dout.

The data output buffer enable signal oe at the node N24 is capable of disabling the output terminal dout. Namely, when the data output buffer enable signal oe at the node N24 is low in logic, a voltage at the node N22 goes high in logic, thereby causing the high logic transfer device or PMOS transistor Q21 to be turned off. Also, a voltage at the node N23 goes low in logic, thereby causing the low logic transfer device or NMOS transistor Q22 to be turned off. As a result, any data is not transferred to the output terminal dout.

On the contrary, in the case where the data output buffer enable signal oe at the node N24 is high in logic, the PMOS transistor Q19 and the NMOS transistor Q20 are turned off, and the PMOS transistor Q21 and the NMOS transistor Q22 are operated according to logic states of the nodes N22 and N23 to transfer data to the output terminal dout. The NMOS transistor Q25 and the PMOS transistor Q26 have their gates connected in common to the output terminal dout. The NMOS transistor Q25 is operated to allow the high logic transfer device or PMOS transistor Q21 to transfer a high logic signal to the output terminal dout. The PMOS transistor Q26 is operated to allow the low logic transfer device or NMOS transistor Q22 to transfer a low logic signal to the output terminal dout. The use of the NMOS and PMOS transistors Q25 and Q26 results in an increase in the operation speed.

As apparent from the above description, according to the present invention, the data output buffer circuit for the semiconductor device has a high-speed data transfer speed and a small layout area on the chip with the use of single data line. Further, half of the supply voltage is used as the operating voltage. Therefore, the present invention has the effect of reducing power consumption as compared with the conventional art in which the supply voltage is used as the operating voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data output buffer circuit for a semiconductor device for transferring read cell data to peripheral circuits, comprising:

an input terminal for inputting the read cell data, wherein the data from said input terminal is initially precharged with half of a supply voltage;

first data transfer means for transferring the data from said input terminal when it has a first logic level;

second data transfer means for transferring the data from said input terminal when it has a second logic level;

high logic transfer means for transferring a high logic signal in response to an output signal from said first data transfer means;

low logic transfer means for transferring a low logic signal in response to an output signal from said second data transfer means; and an output terminal for outputting the high logic signal from said high logic transfer means or the low logic signal from said low logic transfer means to the peripheral circuits.

2. A data output buffer circuit for a semiconductor device as set forth in claim 1, wherein said first data transfer means comprises an NMOS transistor having its gate for inputting a reference voltage and said second data transfer means comprises a PMOS transistor having its gate for inputting the reference voltage.

3. A data output buffer circuit for a semiconductor device as set forth in claim 2, wherein said first logic level is lower than a level of said reference voltage by a threshold voltage and said second logic level is higher than the level of said reference voltage by the threshold voltage.

4. A data output buffer circuit for a semiconductor device as set forth in claim 3, wherein said reference voltage has said half of the supply voltage level.

5. A data output buffer circuit for a semiconductor device as set forth in claim 1, wherein said high logic transfer means comprises a PMOS transistor and said low logic transfer means comprises an NMOS transistor.

6. A data output buffer circuit for a semiconductor device for transferring read cell data to peripheral circuits, comprising:

an input terminal for inputting the read cell data;

first data transfer means for transferring the data from said input terminal when it has a first logic level;

second data transfer means for transferring the data from said input terminal when it has a second logic level;

high logic transfer means for transferring a high logic signal in response to an output signal from said first data transfer means;

low logic transfer means for transferring a low logic signal in response to an output signal from said second data transfer means;

an output terminal for outputting the high logic signal from said high logic transfer means or the low logic signal from said low logic transfer means to the peripheral circuits;

first operation control means connected between said first data transfer means and said high logic transfer means, for setting a level of the output signal from said first data transfer means to a supply voltage level in a standby mode to control the operation of said high logic transfer means; and second operation control means connected between said second data transfer means and said low logic transfer means, for setting a level of the output signal from said second data transfer means to a ground voltage level in the standby mode to control the operation of said low logic transfer means;

wherein the data form said input terminal is initially precharged with half of a supply voltage level.

7. A data output buffer circuit for a semiconductor device as set forth in claim 6, wherein said first and second operation control means comprise MOS transistors, respectively.

8. A data output buffer circuit for a semiconductor device as set forth in claim 7, wherein said first operation control means comprises a PMOS transistor and said second operation control means comprises a NMOS transistor.

9. A data output buffer circuit for a semiconductor device for transferring read cell data to peripheral circuits, comprising:

an input terminal for inputting the read cell data;

first data transfer means for transferring the data from said input terminal when it has a first logic level;

second data transfer means for transferring the data from said input terminal when it has a second logic level;

high logic transfer means for transferring a high logic signal in response to an output signal from said first data transfer means;

low logic transfer means for transferring a low logic signal in response to an output signal from said second data transfer means;

an output terminal for outputting the high logic signal from said high logic transfer means or the low logic signal from said low logic transfer means to the peripheral circuits;

first operation control means connected between said first data transfer means and said high logic transfer means, for setting a level of the output signal from said first data transfer means to a supply voltage level in a standby mode to control the operation of said high logic transfer means and for controlling an amount of current flowing through said high logic transfer means in an operation mode to transfer the high logic signal to said output terminal; and second operation control means connected between said second data transfer means and said low logic transfer means, for setting a level of the output signal from said second data transfer means to a ground voltage level in the standby mode to control the operation of said low logic transfer means and for controlling an amount of current flowing through said low logic transfer means in the operation mode to transfer the low logic signal to said output terminal.

* * * * *